US010311819B2

(12) United States Patent
Yi

(10) Patent No.: US 10,311,819 B2
(45) Date of Patent: Jun. 4, 2019

(54) CMOS GOA CIRCUIT

(71) Applicant: Wuhan China Star Optoelectronics Technology Co., Ltd., Wuhan (CN)

(72) Inventor: Shijuan Yi, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 93 days.

(21) Appl. No.: 15/511,016

(22) PCT Filed: Feb. 17, 2017

(86) PCT No.: PCT/CN2017/073878
§ 371 (c)(1),
(2) Date: Mar. 14, 2017

(87) PCT Pub. No.: WO2018/129786
PCT Pub. Date: Jul. 19, 2018

(65) Prior Publication Data

US 2018/0301102 A1 Oct. 18, 2018

(30) Foreign Application Priority Data

Jan. 10, 2017 (CN) .......................... 2017 1 0016538

(51) Int. Cl.
*G11C 19/18* (2006.01)
*G11C 19/28* (2006.01)
(Continued)

(52) U.S. Cl.
CPC ......... *G09G 3/3677* (2013.01); *G09G 3/3696* (2013.01); *G09G 2300/0408* (2013.01); *G09G 2310/0283* (2013.01)

(58) Field of Classification Search
CPC ............ G11C 19/00–28; G11C 11/419; G09G 3/20–3677
See application file for complete search history.

(56) References Cited

U.S. PATENT DOCUMENTS 4,914,634 A * 4/1990 Akrout .................. G11C 11/419 365/189.09
2005/0220263 A1* 10/2005 Moon .................... G11C 19/00 377/68

(Continued)

*Primary Examiner* — Lin Li
(74) *Attorney, Agent, or Firm* — Leong C. Lei

(57) ABSTRACT

The invention provides a CMOS GOA circuit, comprising a signal processing module having a first and a second TFTs, the first TFT having a gate connected to a first control signal, a source connected to an output node and a drain connected to a third node; the second TFT having a gate and a source connected to a second control signal, and a drain connected to the third node; the first and second control signals having opposite phases, the first and second control signals controlling the first and second TFTs to turn on alternatingly inputting a voltage signal of the output node or a second control signal to the third node. Compared to the known technique using NAND circuit, the invention reduces the number of TFTs required by latch module without affecting operation of the circuit, and facilitates the implementation of the ultra-narrow border or borderless display products.

16 Claims, 13 Drawing Sheets

(51) Int. Cl.

| | |
|---|---|
| ***G09G 3/36*** | (2006.01) |
| ***G09G 3/20*** | (2006.01) |
| ***G11C 19/00*** | (2006.01) |

(56) References Cited

U.S. PATENT DOCUMENTS

2006/0061395 A1* 3/2006 Noto ...................... H03K 5/086
327/108
2010/0283715 A1* 11/2010 Kretz ....................... G09G 3/20
345/100
2011/0310074 A1* 12/2011 Ochiai ................. G09G 3/3674
345/208
2014/0192039 A1* 7/2014 Wang ..................... G11C 19/28
345/213
2016/0351112 A1* 12/2016 Qing ........................ G09G 3/20
2017/0256220 A1* 9/2017 Huang ................. G09G 3/3677
2018/0059829 A1* 3/2018 Chen ........................ G09G 3/36

* cited by examiner

CMOS GOA CIRCUIT

BACKGROUND OF THE INVENTION

1. Field of the Invention

The present invention relates to the field of display techniques, and in particular to a complementary metal-oxide-semiconductor (CMOS) gate driver on array (GOA) circuit.

2. The Related Arts

The liquid crystal display (LCD) provides many advantages, such as thinness, low power-consumption and no radiation, and is widely used in, such as, LCD televisions, mobile phones, personal digital assistants (PDAs), digital cameras, computer screens, laptop screens, and so on. The LCD technology also dominates the field of panel displays.

Most of the LCDs on the current market are of backlight type, which comprises an LCD panel and a backlight module. The operation theory behind LCD is to inject the liquid crystal (LC) molecules between a thin film transistor (TFT) array substrate and a color filter (CF) substrate, and applies a driving voltage between the two substrates to control the rotation direction of the LC molecules to refract the light from the backlight module to generate the display on the screen.

In the active LCD, each pixel is electrically connected to a TFT, with a gate connected to a horizontal scan line, a drain connected to a data line in a vertical direction, and a source connected to a pixel electrode. When a sufficient positive voltage is applied to a horizontal scan line, all the TFTs connected to the scan line are turned on, the signal voltage loaded on the data line is written into the pixel to control the transmittance of different liquid crystals to achieve the effect of color control. The driving of the horizontal scan line of the current active LCD is mainly executed by an external integrated circuit (IC). The external IC can control the charge and discharge of the horizontal scan line in each stage progressively. The gate driver on array (GOA) technology, i.e., the array substrate row driving technology, can use the array process of the LCD panel to manufacture the driver circuit of the horizontal scan lines on the substrate at area surrounding the active area to replace the external IC for driving the horizontal scan lines. The GOA technology can reduce the bonding process for external IC and has the opportunity to enhance yield rate and reduce production cost, as well as make the LCD panel more suitable for the production of narrow border display products.

The known CMOS GOA circuit often uses NAND gate circuit for signal processing and requires more TFTs (in general, four TFTs), and as a result, not suitable for narrow border panel. Therefore, a novel CMOS GOA circuit to reduce the number of TFTs used to reduce the border size of the display product is imperative.

SUMMARY OF THE INVENTION

The object of the present invention is to provide a CMOS GOA circuit, able to reduce the number of TFTs required by the CMOS GOA circuit to reduce the border size of display products.

To achieve the above object, the present invention provides a CMOS GOA circuit, which comprises a plurality of stages of GOA units, wherein the odd-numbered stages of GOA units being cascaded and the even-numbered stages of GOA units being cascaded;

each GOA unit comprising: a forward-and-backward scan control module, a control input module, a reset module, a latch module, a signal processing module, and an output buffer module;

for positive numbers M and N, other than the GOA units in the first stage, the second stage, the second last stage and the last stage, in each N-th GOA unit:

the forward-and-backward scan control module being connected to receive a voltage signal of a first node of the (N−2)-th GOA unit, a voltage signal of a first node of the (N+2)-th GOA unit, a forward scan signal and a backward scan signal, for controlling the GOA circuit to perform forward scan or backward scan according to the voltage change of the forward scan signal and the backward scan signal;

the control input module being connected to the forward-and-backward control module and receiving an M-th clock signal and an M-th inverse clock signal, for inverting the voltage signal of the first node of the (N−2)-th GOA unit or the first node of the (N+2)-th GOA unit transmitted from the forward-and-backward control module according to the M-th clock signal and the M-th inverse clock signal, and outputting to a second node;

the reset module being connected to receive a reset signal and a constant high voltage signal, and connected to the second node for clearing the voltage signal of the first node according to the reset signal;

the latch module being connected to receive the M-th clock signal and the M-th inverse clock signal, and connected to the first node and the second node, for inverting a voltage signal of the second node and outputting to the first node, and latching the voltage signal of the first node according to the M-th clock signal and the M-th inverse clock signal to maintain the voltage signals of the first node and the second node having opposite phases;

the signal processing module comprising: a first TFT and a second TFT; the first TFT having a gate connected to receive a first control signal, a source connected to an output node and a drain connected to a third node; the second TFT having a gate and a source connected to receive a second control signal, and a drain connected to the third node; the first control signal and the second control signal having opposite phases, the first control signal and the second control signal controlling the first TFT and the second TFT to turn on alternatingly input a voltage signal of the output node or a second control signal to the third node;

the output buffer module being connected to the third node, for inverting a voltage signal of the third node a plurality of times before outputting as a gate scan driving signal.

According to a preferred embodiment of the present invention, the first TFT and the second TFT are N-type TFTs, the output node is the second node, the first control signal is the (M+2)-th clock signal, the second control signal is the (M+2)-th inverse clock signal, the output buffer module inverts the voltage signal of the third node for an odd number of times before outputting as a gate scan driving signal.

According to a preferred embodiment of the present invention, the first TFT and the second TFT are P-type TFTs, the output node is the first node, the first control signal is the (M+2)-th inverse clock signal, the second control signal is the (M+2)-th clock signal, the output buffer module inverts the voltage signal of the third node for an even number of times before outputting as a gate scan driving signal.

According to a preferred embodiment of the present invention, the forward-and-backward scan control module comprises: a first transmission gate and a second transmission gate; the control input module comprises: a first clock control inverter; the reset module comprises: a third TFT; and the latch module comprises a second clock control inverter and a first inverter;

the first transmission gate has a low voltage control end connected to the forward scan signal, a high voltage control end connected to the backward scan signal, an input end connected to the first node of the (N−2)-th GOA unit, and an output end connected to an input end of the first clock control inverter;

the second transmission gate has a high voltage control end connected to the forward scan signal, a low voltage control end connected to the backward scan signal, an input end connected to the first node of the (N+2)-th GOA unit, and an output end connected to the input end of the first clock control inverter;

the first clock control inverter has a high voltage control end connected to receive the M-th clock signal, a low voltage control end connected to receive the M-th inverse clock signal, and an output end connected to the second node;

the third TFT is a P-type TFT, and has a gate connected to receive the reset signal, a source connected to receive the constant high voltage signal, and a drain connected to the second node;

the second clock control inverter has a low voltage control end connected to receive the M-th clock signal, a high voltage control end connected to receive the M-th inverse clock signal, an input end connected to the first node, and an output end connected to the second node;

the first inverter has an input end connected to the second node and an output end connected to the first node.

According to a preferred embodiment of the present invention, the output buffer module comprises a second inverter, a third inverter, and a fourth inverter; the second inverter has an input end connected to the third node and an output end connected to an input end of the third inverter; the third inverter has an output end connected to an input end of the fourth inverter; the fourth inverter has an output end outputting the gate scan driving signal.

According to a preferred embodiment of the present invention, the output buffer module comprises a second inverter and a third inverter; the second inverter has an input end connected to the third node and an output end connected to an input end of the third inverter; the third inverter has an output end outputting the gate scan driving signal.

According to a preferred embodiment of the present invention, the clock signals comprises four clock signals: a first clock signal, a second clock signal, a third clock signal, and a fourth clock signal; when the M-th clock signal is the third clock signal, the (M+2)-th t clock signal is the first clock signal; when the M-th clock signal is the fourth clock signal, the (M+2)-th clock signal is the second clock signal;

the GOA units of the cascaded odd-numbered stages are connected to the first clock signal and the third clock signal; the GOA units of the cascaded even-numbered stages are connected to the second clock signal and the fourth clock signal.

According to a preferred embodiment of the present invention, when the forward scan signal provides low voltage and the backward scan signal provides high voltage, the forward scan is performed; when the forward scan signal provides high voltage and the backward scan signal provides low voltage, the backward scan is performed.

According to a preferred embodiment of the present invention, in the GOA units of the first stage and the second stage, the input end of the first transmission gate is connected to a start signal of the GOA circuit;

in the GOA units of the last stage and the second last stage, the input end of the second transmission gate is connected to the start signal of the GOA circuit.

According to a preferred embodiment of the present invention, when the GOA circuit applied to a display panel with a structure of dual-side driving and scan every other row, the GOA units of cascaded odd-numbered stages and the GOA units of cascaded even-numbered stages of the display panel are disposed respectively at left and right sides of the display panel.

Another embodiment of the present invention provides CMOS GOA circuit, which comprises a plurality of stages of GOA units, wherein the odd-numbered stages of GOA units being cascaded and the even-numbered stages of GOA units being cascaded;

each GOA unit comprising: a forward-and-backward scan control module, a control input module, a reset module, a latch module, a signal processing module, and an output buffer module;

for positive numbers M and N, other than the GOA units in the first stage, the second stage, the second last stage and the last stage, in each N-th GOA unit:

the forward-and-backward scan control module being connected to receive a voltage signal of a first node of the (N−2)-th GOA unit, a voltage signal of a first node of the (N+2)-th GOA unit, a forward scan signal and a backward scan signal, for controlling the GOA circuit to perform forward scan or backward scan according to the voltage change of the forward scan signal and the backward scan signal;

the control input module being connected to the forward-and-backward control module and receiving an M-th clock signal and an M-th inverse clock signal, for inverting the voltage signal of the first node of the (N−2)-th GOA unit or the first node of the (N+2)-th GOA unit transmitted from the forward-and-backward control module according to the M-th clock signal and the M-th inverse clock signal, and outputting to a second node;

the reset module being connected to receive a reset signal and a constant high voltage signal, and connected to the second node for clearing the voltage signal of the first node according to the reset signal;

the latch module being connected to receive the M-th clock signal and the M-th inverse clock signal, and connected to the first node and the second node, for inverting a voltage signal of the second node and outputting to the first node, and latching the voltage signal of the first node according to the M-th clock signal and the M-th inverse clock signal to maintain the voltage signals of the first node and the second node having opposite phases;

the signal processing module comprising: a first TFT and a second TFT; the first TFT having a gate connected to receive a first control signal, a source connected to an output node and a drain connected to a third node; the second TFT having a gate and a source connected to receive a second control signal, and a drain connected to the third node; the first control signal and the second control signal having opposite phases, the first control signal and the second control signal controlling the first TFT and the second TFT to turn on alternatingly input a voltage signal of the output node or a second control signal to the third node;

the output buffer module being connected to the third node, for inverting a voltage signal of the third node a plurality of times before outputting as a gate scan driving signal;

wherein the first TFT and the second TFT beinge N-type TFTs, the output node being the second node, the first control signal being the (M+2)-th clock signal, the second control signal being the (M+2)-th inverse clock signal, the output buffer module inverting the voltage signal of the third node for an odd number of times before outputting as a gate scan driving signal;

wherein when the GOA circuit applied to a display panel with a structure of dual-side driving and scan every other row, the GOA units of cascaded odd-numbered stages and the GOA units of cascaded even-numbered stages of the display panel being disposed respectively at left and right sides of the display panel.

The present invention provides the following advantages. The present invention provides a CMOS GOA circuit, comprising a signal processing module having a first TFT and a second TFT, the first TFT having a gate connected to receive a first control signal, a source connected to an output node and a drain connected to a third node; the second TFT having a gate and a source connected to receive a second control signal, and a drain connected to the third node; the first control signal and the second control signal having opposite phases, the first control signal and the second control signal controlling the first TFT and the second TFT to turn on alternatingly input a voltage signal of the output node or a second control signal to the third node; Compared to the known technique using NAND circuit, the present invention reduces the number of TFTs required by the latch module without affecting the normal operation of the circuit, and facilitates the implementation of the ultra-narrow border or borderless display products.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 1:
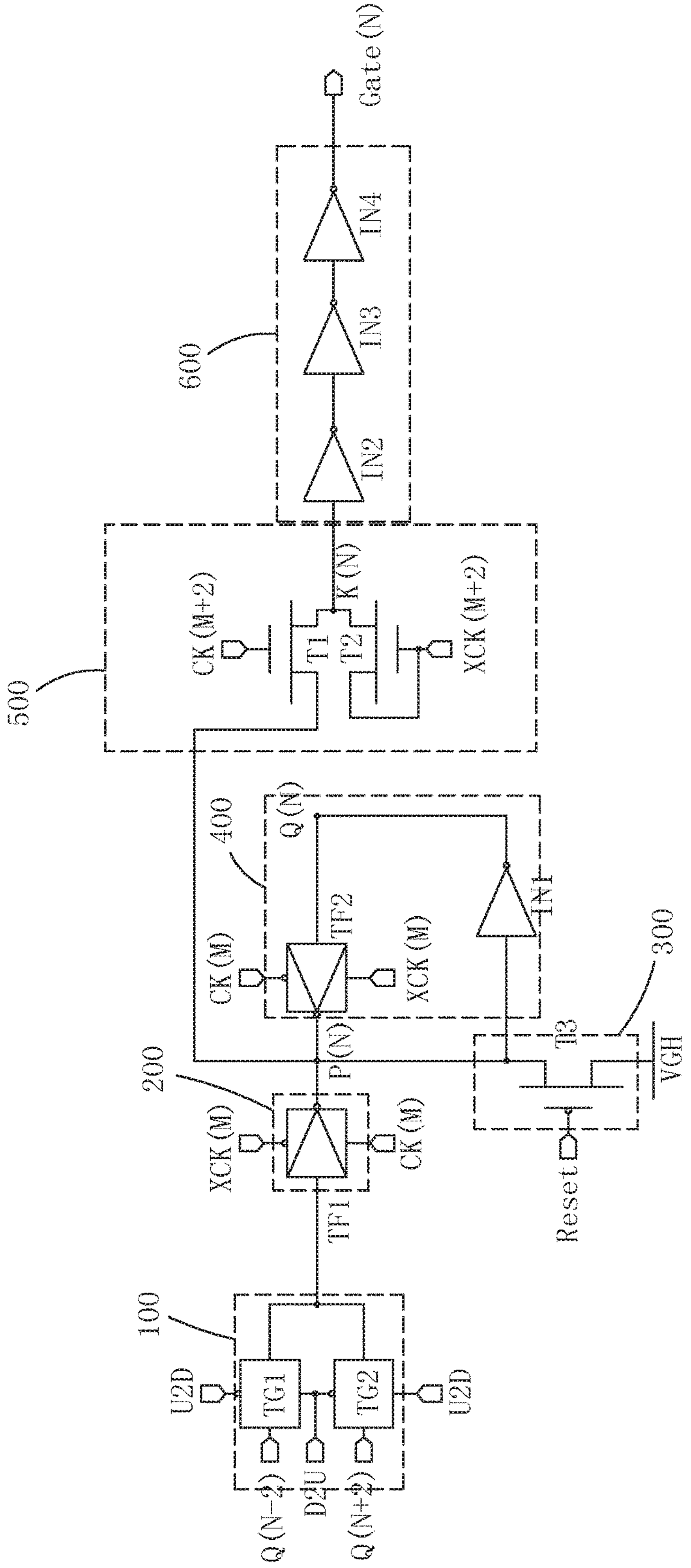
FIG. 1 is a schematic view showing the CMOS GOA circuit provided by the first embodiment of the present invention.
Figure 2:
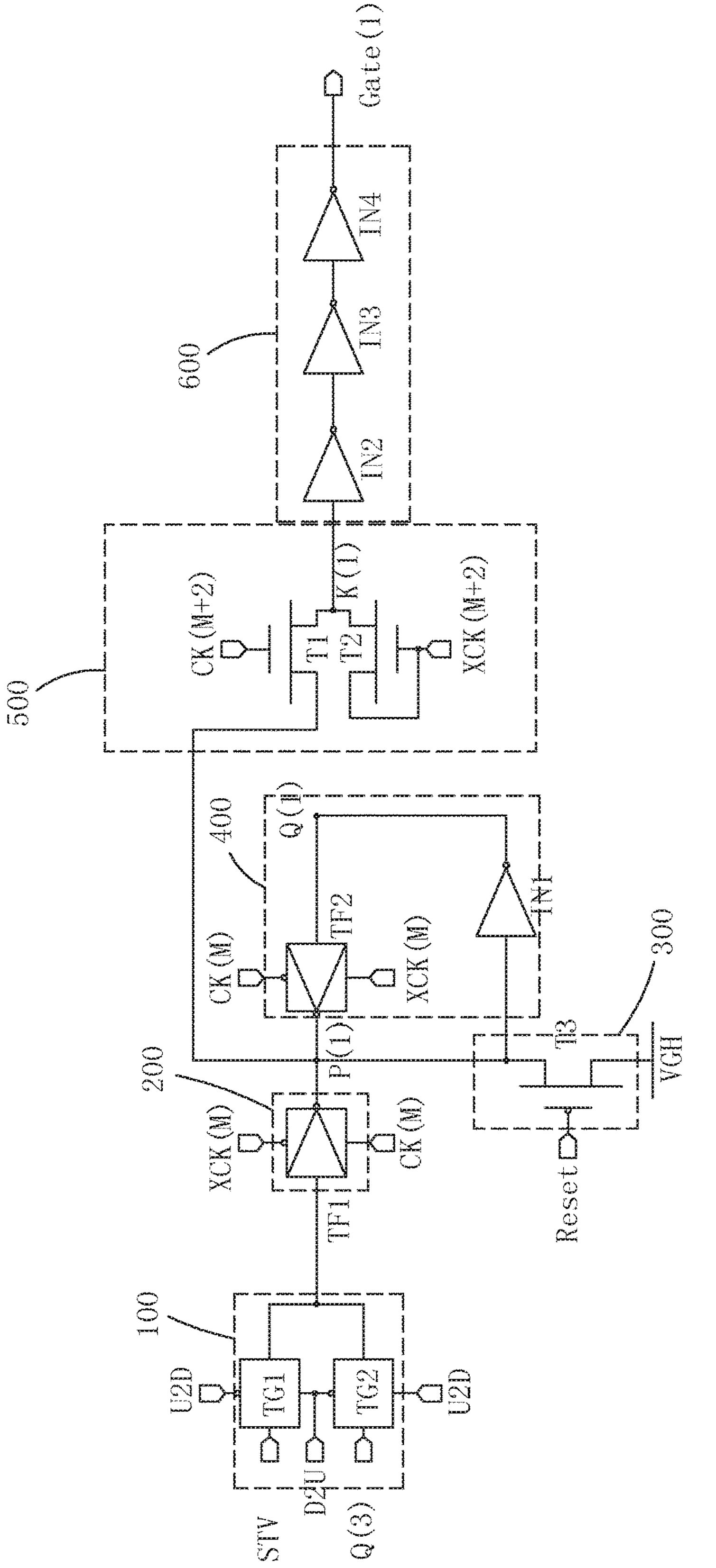
FIG. 2 is a schematic view showing a circuit of the first GOA units of the CMOS GOA circuit provided by the first embodiment of the present invention.
Figure 3:
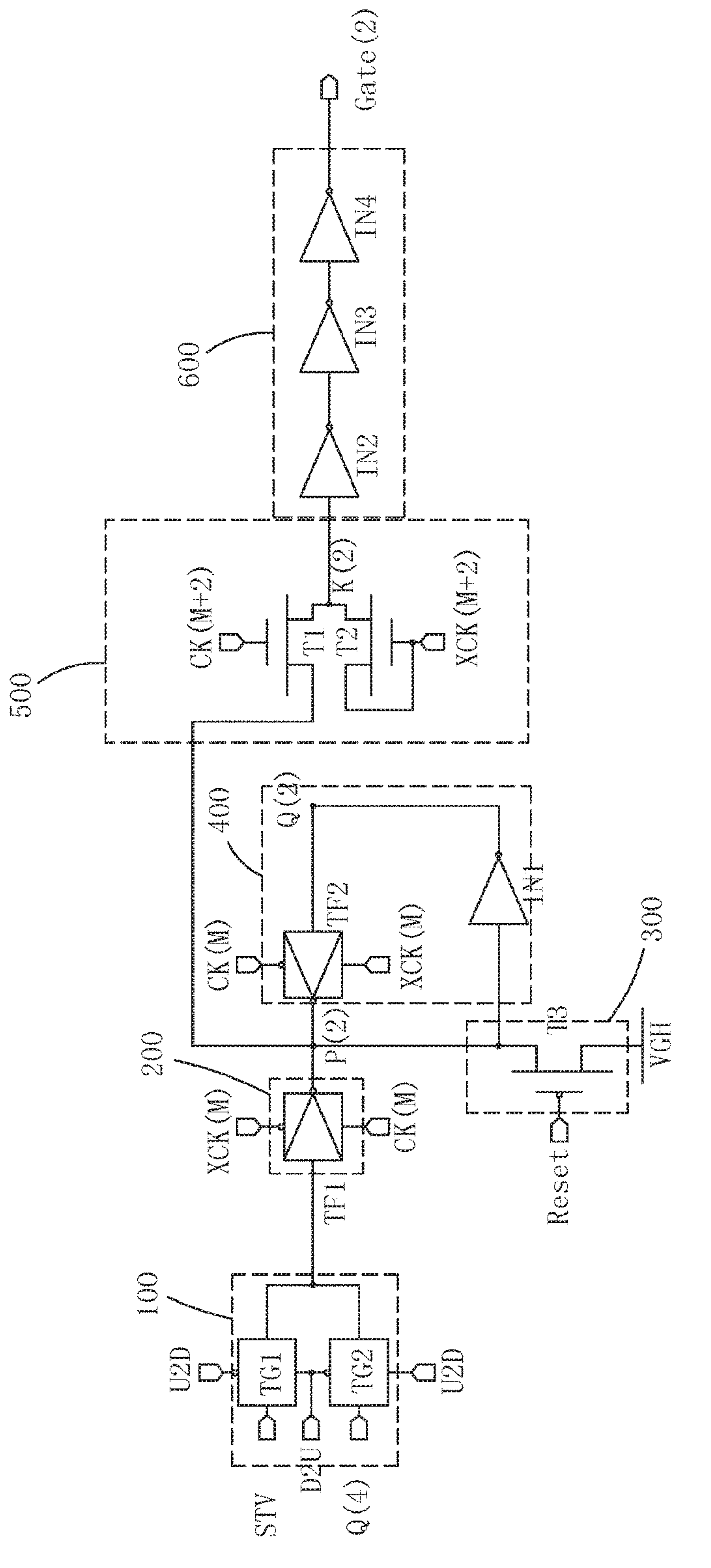
FIG. 3 is a schematic view showing a circuit of the second GOA unit of the first stage of the CMOS GOA circuit provided by the first embodiment of the present invention.
Figure 4:
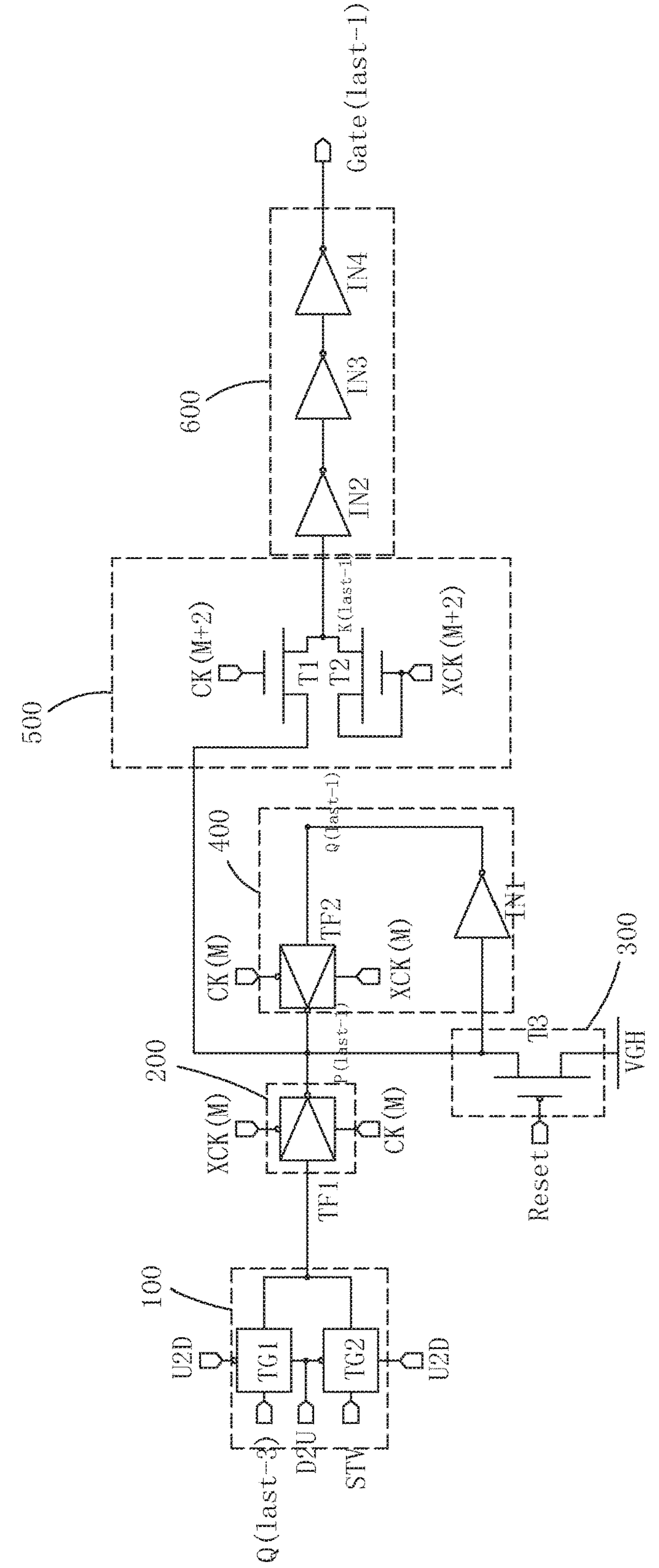
FIG. 4 is a schematic view showing a circuit of the second last GOA unit of the first stage of the CMOS GOA circuit provided by the first embodiment of the present invention.
Figure 5:
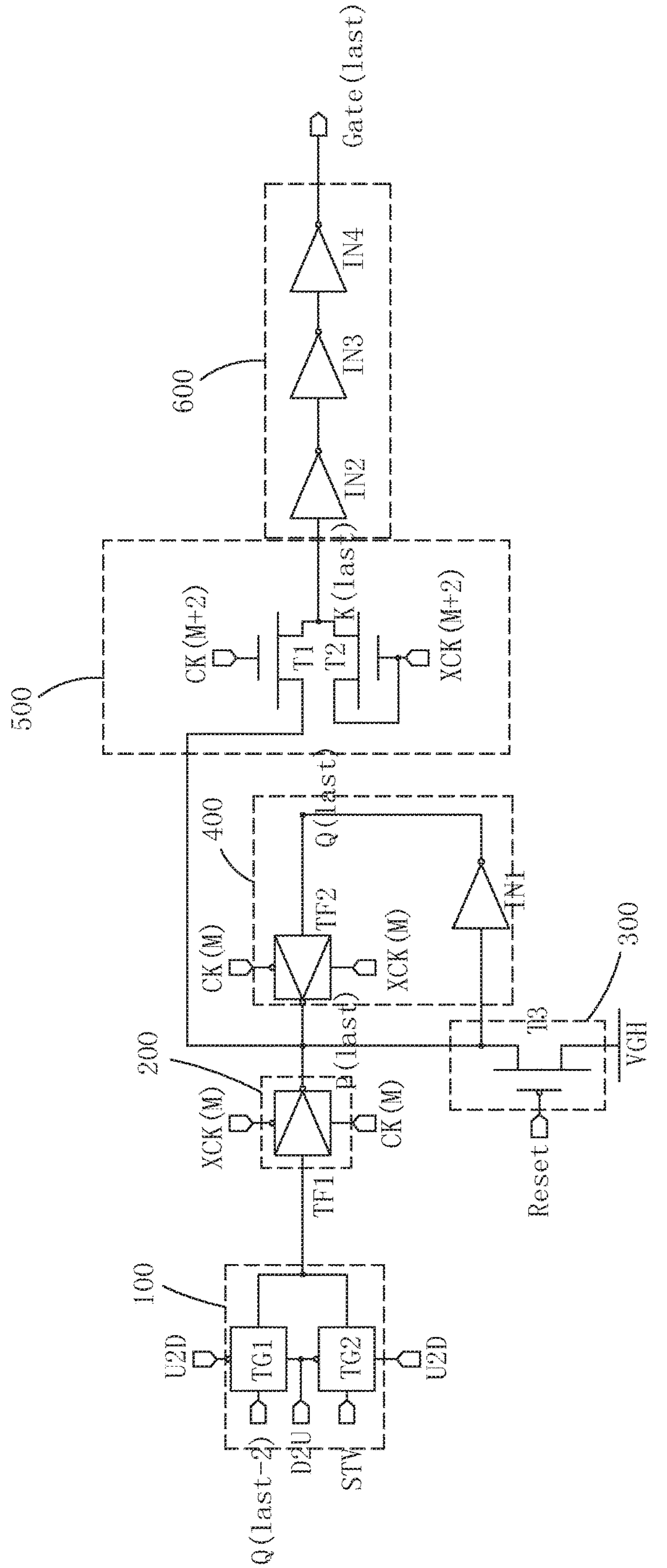
FIG. 5 is a schematic view showing a circuit of the last GOA unit of the first stage of the CMOS GOA circuit provided by the first embodiment of the present invention.
Figure 6:
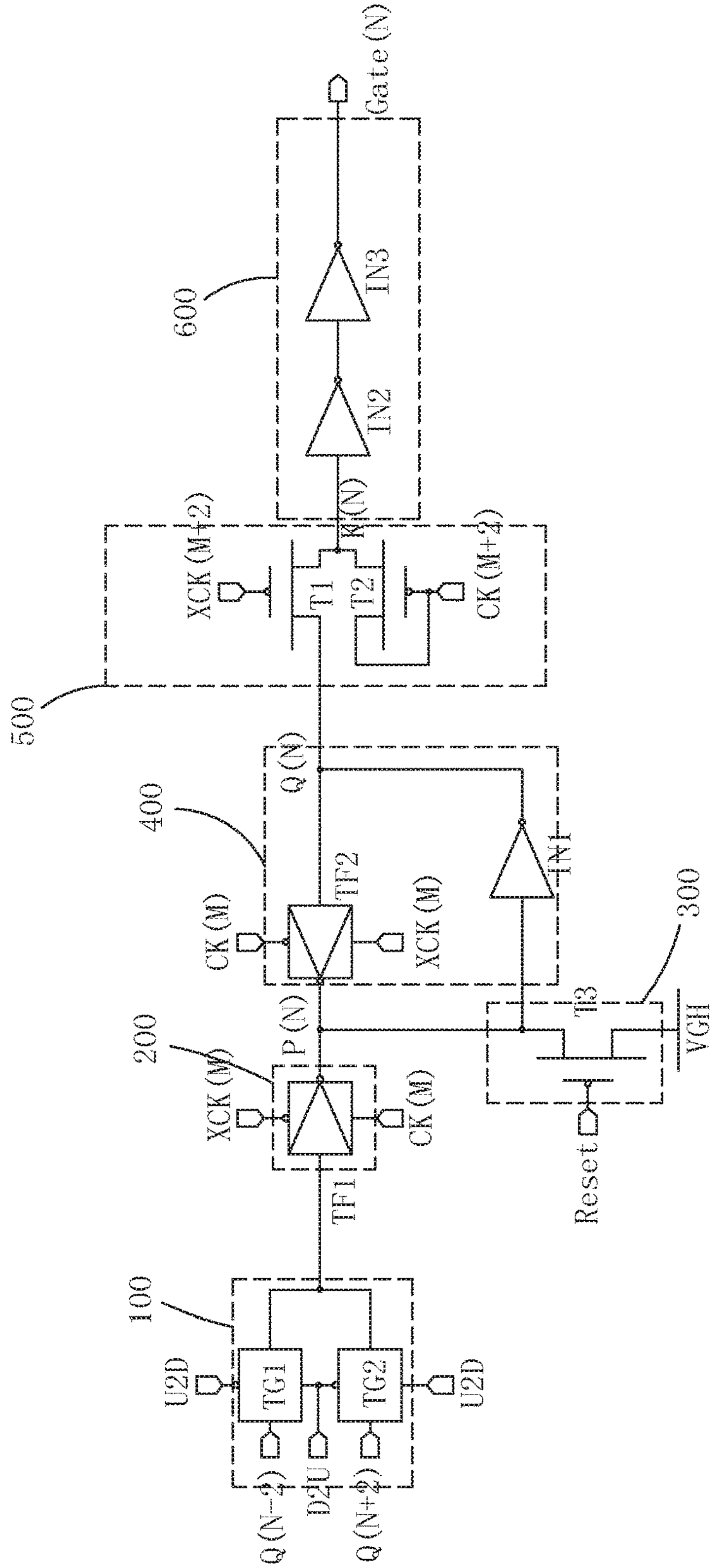
FIG. 6 is a schematic view showing the CMOS GOA circuit provided by the second embodiment of the present invention.
Figure 7:
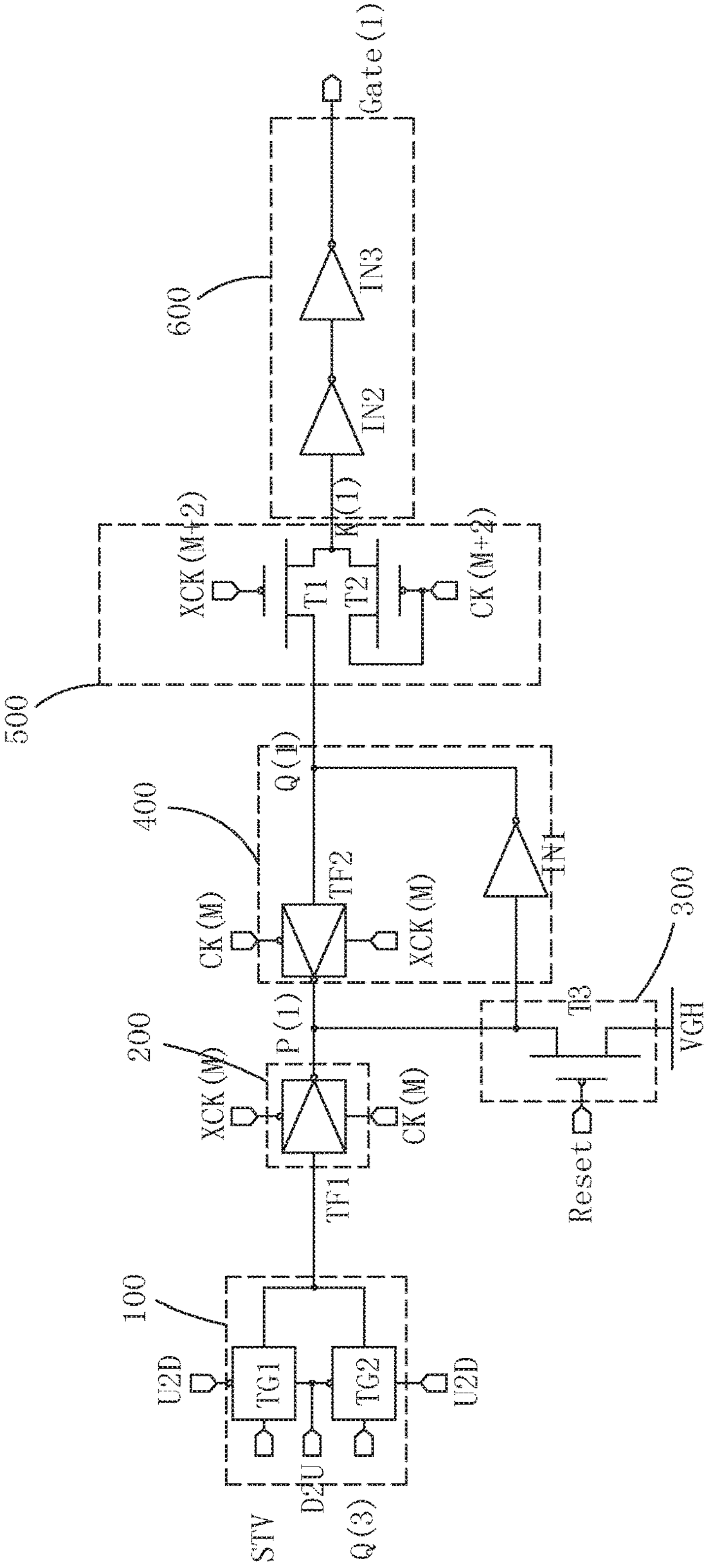
FIG. 7 is a schematic view showing a circuit of the first GOA units of the CMOS GOA circuit provided by the second embodiment of the present invention.
Figure 8:
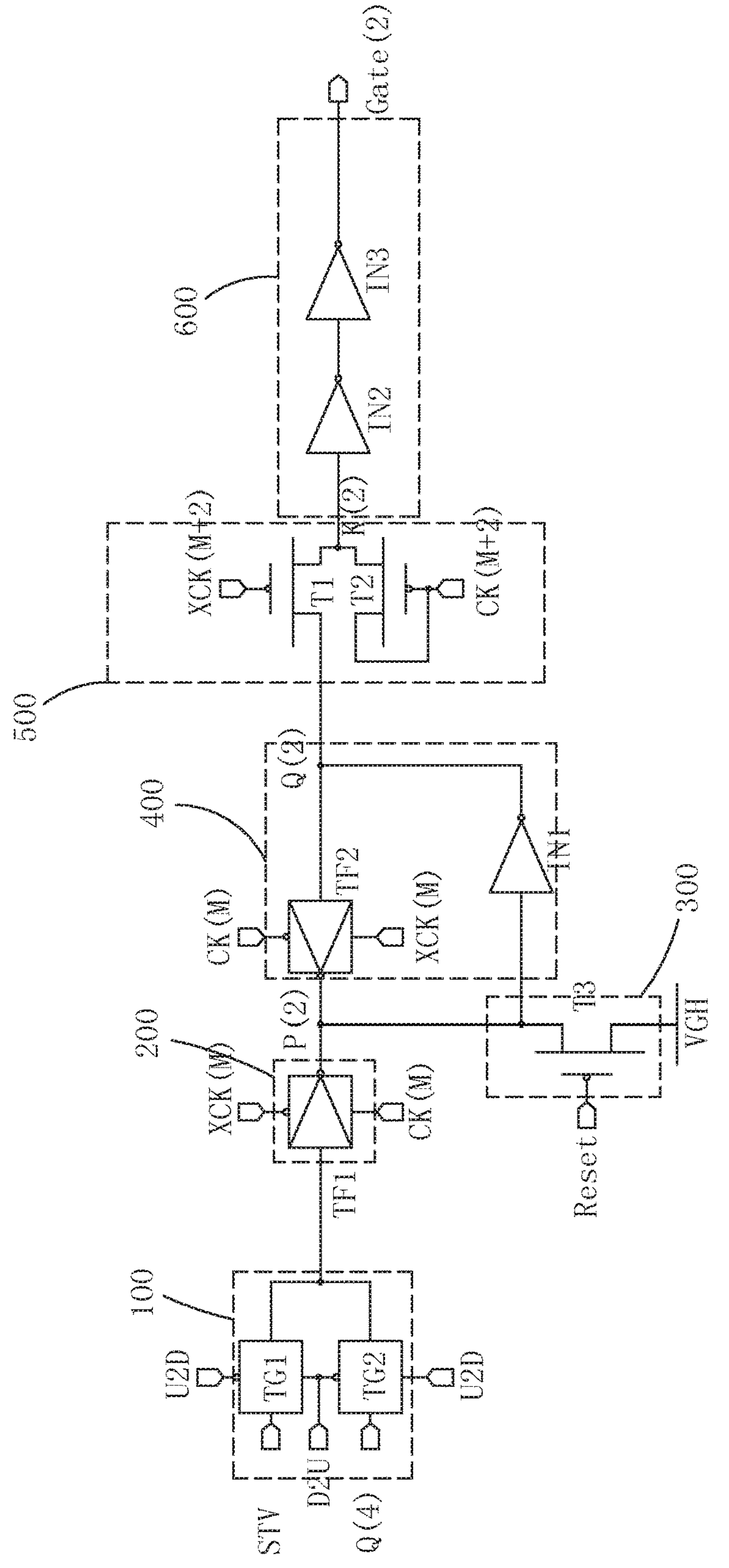
FIG. 8 is a schematic view showing a circuit of the second GOA units of the CMOS GOA circuit provided by the second embodiment of the present invention.
Figure 9:
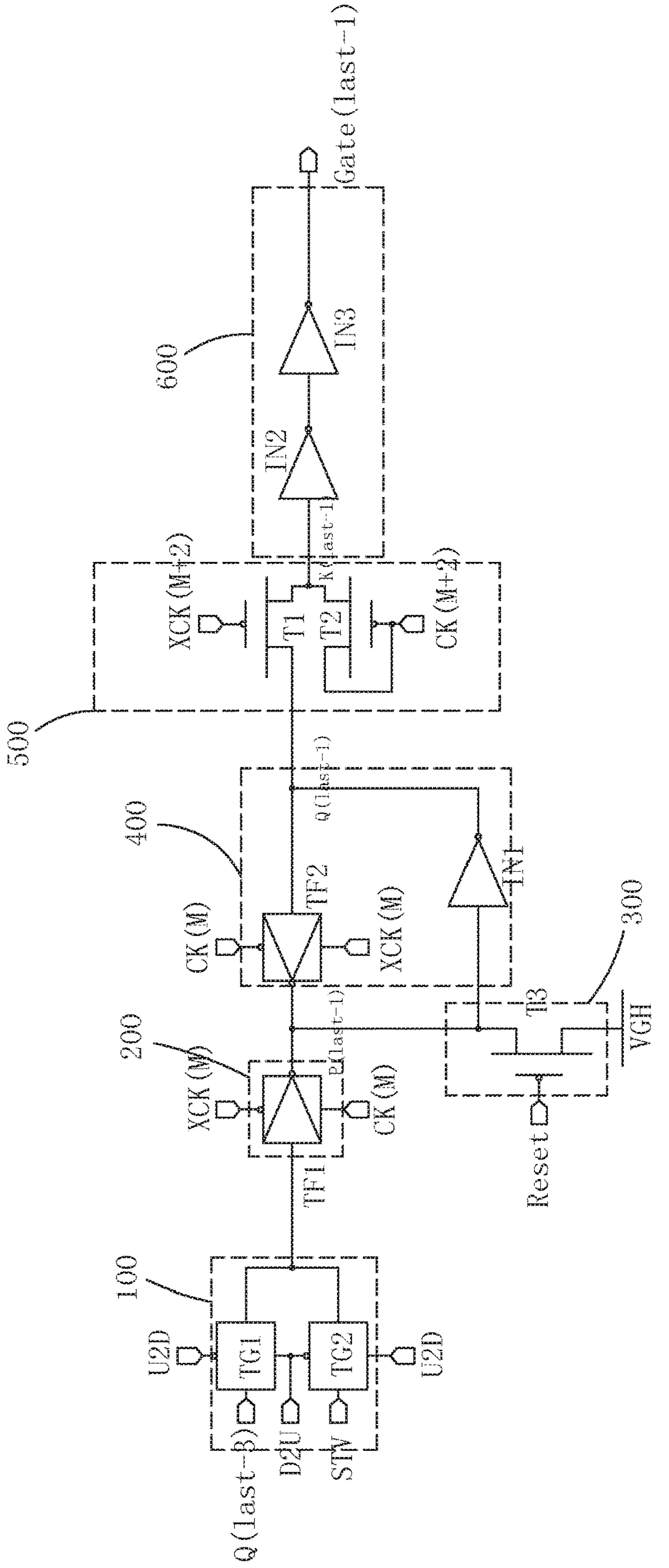
FIG. 9 is a schematic view showing a circuit of the second last GOA units of the CMOS GOA circuit provided by the second embodiment of the present invention.
Figure 10:
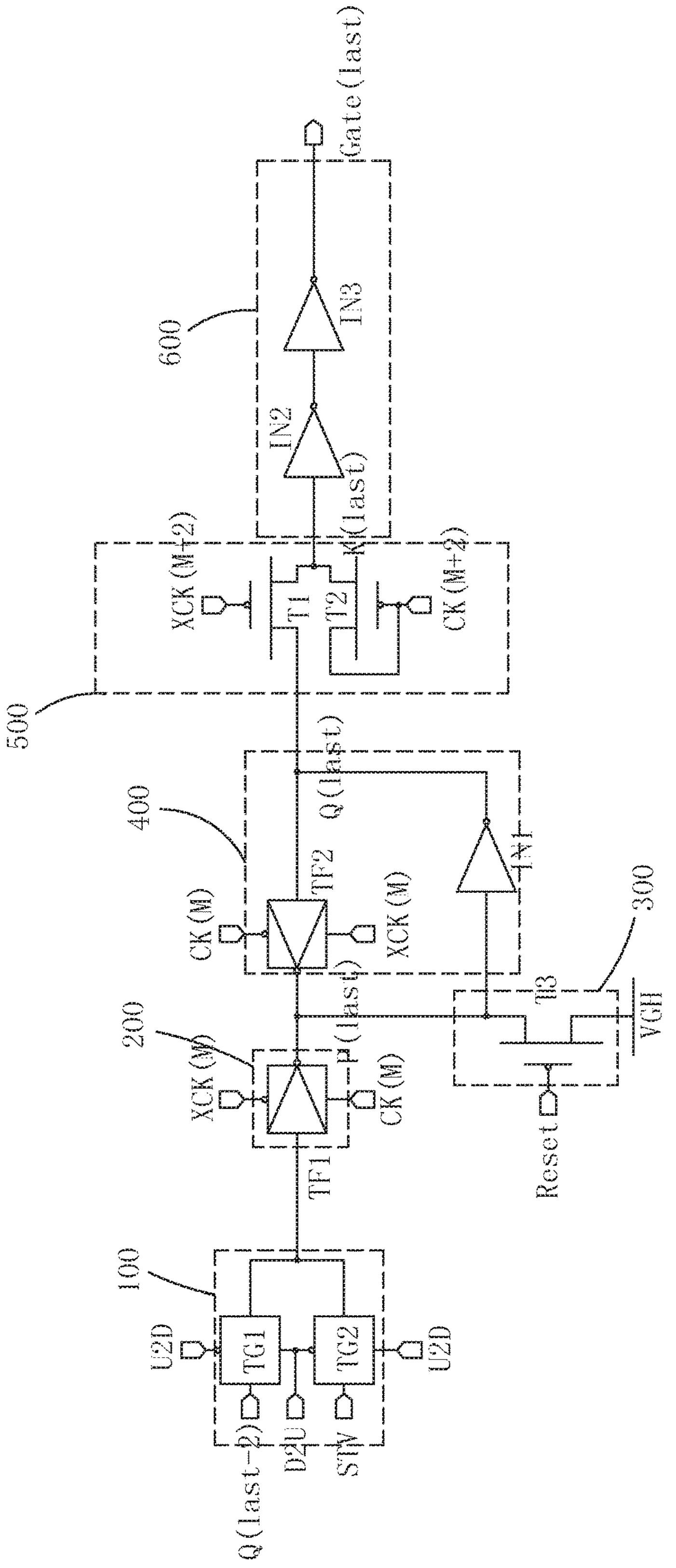
FIG. 10 is a schematic view showing a circuit of the last GOA units of the CMOS GOA circuit provided by the second embodiment of the present invention.

Referring to FIG. 1 or FIG. 6, the present invention provides a structure of CMOS GOA circuit, which comprises: CMOS GOA circuit, which comprises a plurality of stages of GOA units, wherein the odd-numbered stages of GOA units are cascaded and the even-numbered stages of GOA units are cascaded.

Each GOA unit comprises: a forward-and-backward scan control module 100, a control input module 200, a reset module 300, a latch module 400, a signal processing module 500, and an output buffer module 600.

For positive numbers M and N, other than the GOA units in the first stage, the second stage, the second last stage and the last stage, in each N-th GOA unit:

The forward-and-backward scan control module 100 is connected to receive a voltage signal of a first node Q(N−2) of the (N−2)-th GOA unit, a voltage signal of a first node Q(N+2) of the (N+2)-th GOA unit, a forward scan signal U2D and a backward scan signal D2U, for controlling the GOA circuit to perform forward scan or backward scan according to the voltage change of the forward scan signal U2D and the backward scan signal D2U.

The control input module 200 is connected to the forward-and-backward control module 100 and receives an M-th clock signal CK(M) and an M-th inverse clock signal XCK(M), for inverting the voltage signal of the first node Q(N−2) of the (N−2)-th GOA unit or the first node Q(N+2) of the (N+2)-th GOA unit transmitted from the forward-and-backward control module 100 according to the M-th clock signal CK(M) and the M-th inverse clock signal XCK(M), and outputting to a second node P(N).

The reset module 300 is connected to receive a reset signal Reset and a constant high voltage signal VGH, and connected to the second node P(N) for clearing the voltage signal of the first node Q(N) according to the reset signal Reset.

The latch module 400 is connected to receive the M-th clock signal CK(M) and the M-th inverse clock signal XCK(M), and connected to the first node Q(N) and the second node P(N), for inverting a voltage signal of the second node P(N) and outputting to the first node Q(N), and latching the voltage signal of the first node Q(N) according to the M-th clock signal CK(M) and the M-th inverse clock signal XCK(M) to maintain the voltage signals of the first node Q(N) and the second node P(N) having opposite phases.

The signal processing module 500 comprises: a first TFT T1 and a second TFT T2. The first TFT T1 has a gate connected to receive a first control signal, a source connected to an output node and a drain connected to a third node K(N); the second TFT T2 has a gate and a source connected to receive a second control signal, and a drain connected to the third node K(N); the first control signal and the second control signal having opposite phases, the first control signal and the second control signal controlling the first TFT T1 and the second TFT T2 to turn on alternatingly input a voltage signal of the output node or a second control signal to the third node K(N).

The output buffer module 600 is connected to the third node K(N), for inverting a voltage signal of the third node a plurality of times before outputting as a gate scan driving signal Gate(N).

Specifically, refer to FIG. 1 or FIG. 6. In the first embodiment and the second embodiment of the present invention, the forward-and-backward scan control module 100, the control input module 200, the reset module 300 and the latch module 400 have the same structure, wherein the forward-and-backward scan control module 100 comprises: a first transmission gate TG1 and a second transmission gate TG2; the control input module 200 comprises: a first clock control inverter TF1; the reset module 300 comprises: a third TFT T3; and the latch module 400 comprises a second clock control inverter TF2 and a first inverter IN1.

The first transmission gate TG1 has a low voltage control end connected to the forward scan signal U2D, a high voltage control end connected to the backward scan signal D2U, an input end connected to the first node Q(N−2) of the (N−2)-th GOA unit, and an output end connected to an input end of the first clock control inverter TF1.

The second transmission gate TG2 has a high voltage control end connected to the forward scan signal U2D, a low voltage control end connected to the backward scan signal D2U, an input end connected to the first node Q(N+2) of the (N+2)-th GOA unit, and an output end connected to the input end of the first clock control inverter TF1.

The first clock control inverter TF1 has a high voltage control end connected to receive the M-th clock signal CK(M), a low voltage control end connected to receive the M-th inverse clock signal XCK(M), and an output end connected to the second node P(N).

The third TFT T3 is a P-type TFT, and has a gate connected to receive the reset signal Reset, a source connected to receive the constant high voltage signal VGH, and a drain connected to the second node P(N).

The second clock control inverter TF2 has a low voltage control end connected to receive the M-th clock signal CK(M), a high voltage control end connected to receive the M-th inverse clock signal XCK(M), an input end connected to the first node Q(N), and an output end connected to the second node P(N).

The first inverter IN1 has an input end connected to the second node P(N) and an output end connected to the first node Q(N).

Specifically, refer to FIG. 1 and FIG. 6. The signal processing module 500 and the output buffer module 600 can have two different structures, as shown in the first embodiment and the second embodiment. In the first embodiment, the first TFT T1 and the second TFT T2 are N-type TFTs, the output node is the second node P(N), the first control signal is the (M+2)-th clock signal CK(M+2), the second control signal is the (M+2)-th inverse clock signal XCK(M+2), the output buffer module 600 inverts the voltage signal of the third node K(N) for an odd number of times before outputting as a gate scan driving signal Gate (N). In the second embodiment, the first TFT T1 and the second TFT T2 are P-type TFTs, the output node is the first node Q(N), the first control signal is the (M+2)-th inverse clock signal XCK(M+2), the second control signal is the (M+2)-th clock signal CK(M+2), the output buffer module 600 inverts the voltage signal of the third node K(N) for an even number of times before outputting as a gate scan driving signal Gate(N).

Preferably, as shown in FIG. 1, in the first embodiment of the present invention, the output buffer module 600 comprises a second inverter IN2, a third inverter IN3, and a fourth inverter IN4; the second inverter IN2 has an input end connected to the third node K(N) and an output end connected to an input end of the third inverter IN3; the third inverter IN3 has an output end connected to an input end of the fourth inverter IN4; the fourth inverter IN4 has an output end outputting the gate scan driving signal Gate(N).

Preferably, as shown in FIG. 6, in the second embodiment of the present invention, the output buffer module 600 comprises a second inverter IN2 and a third inverter IN3; the second inverter IN2 has an input end connected to the third node K(N) and an output end connected to an input end of the third inverter IN3; the third inverter has an output end outputting the gate scan driving signal Gate(N).

It should be noted that the clock signals comprises four clock signals: a first clock signal CK(1), a second clock signal CK(2), a third clock signal CK(3), and a fourth clock signal CK(4); when the M-th clock signal CK(M) is the third clock signal CK(3), the (M+2)-th t clock signal CK(M+2) is the first clock signal CK(1); when the M-th clock signal CK(M) is the fourth clock signal CK(4), the (M+2)-th clock signal CK(M+2) is the second clock signal CK(2). The falling edge of a previous output clock signal is generated simultaneously with the rising edge of a next output clock signal.

The GOA units of the cascaded odd-numbered stages are connected to the first clock signal CK(1) and the third clock signal CK(3); the GOA units of the cascaded even-numbered stages are connected to the second clock signal CK(2) and the fourth clock signal CK(4).

The inverse clock signals comprises four inverse clock signals: a first inverse clock signal XCK(1), a second inverse clock signal XCK(2), a third inverse clock signal XCK(3), and a fourth inverse clock signal XCK(4); which are obtained respectively by inverting the first clock signal CK(1), the second clock signal CK(2), the third clock signal CK(3), and the fourth clock signal CK(4).

Moreover, for the GOA units of two cascaded neighboring odd-numbered stages, the control input module 200 and the latch module 400 of one of the GOA units receive the first clock signal CK(1) and the first inverse clock signal XCK (1), the signal processing module 500 receives the third clock signal CK(3) and the third inverse clock signal XCK (3); and in the other GOA unit, the control input module 200 and the latch module 400 receive the third clock signal CK(3) and the third inverse clock signal XCK(3), and the signal processing module 500 receives the first clock signal CK(1) and the first inverse clock signal XCK(1). For the GOA units of two cascaded neighboring even-numbered stages, the control input module 200 and the latch module

400 of one of the GOA units receive the second clock signal CK(2) and the second inverse clock signal XCK(2), the signal processing module 500 receives the fourth clock signal CK(4) and the fourth inverse clock signal XCK(4); and in the other GOA unit, the control input module 200 and the latch module 400 receive the fourth clock signal CK(4) and the fourth inverse clock signal XCK(4), and the signal processing module 500 receives the second clock signal CK(2) and the second inverse clock signal XCK(2).

Specifically, when the forward scan signal U2D provides low voltage and the backward scan signal D2U provides high voltage, the forward scan is performed; when the forward scan signal U2D provides high voltage and the backward scan signal D2U provides low voltage, the backward scan is performed.

Refer to FIGS. 2-5. For the first embodiment of the present invention, in the GOA units of the first stage and the second stage, the input end of the first transmission gate TG1 is connected to a start signal STV of the GOA circuit; in the GOA units of the last stage and the second last stage, the input end of the second transmission gate TG2 is connected to the start signal STV of the GOA circuit. Correspondingly, for the second embodiment of the present invention, in the GOA units of the first stage and the second stage, the input end of the first transmission gate TG1 is connected to a start signal STV of the GOA circuit; in the GOA units of the last stage and the second last stage, the input end of the second transmission gate TG2 is connected to the start signal STV of the GOA circuit.

Figure 11:
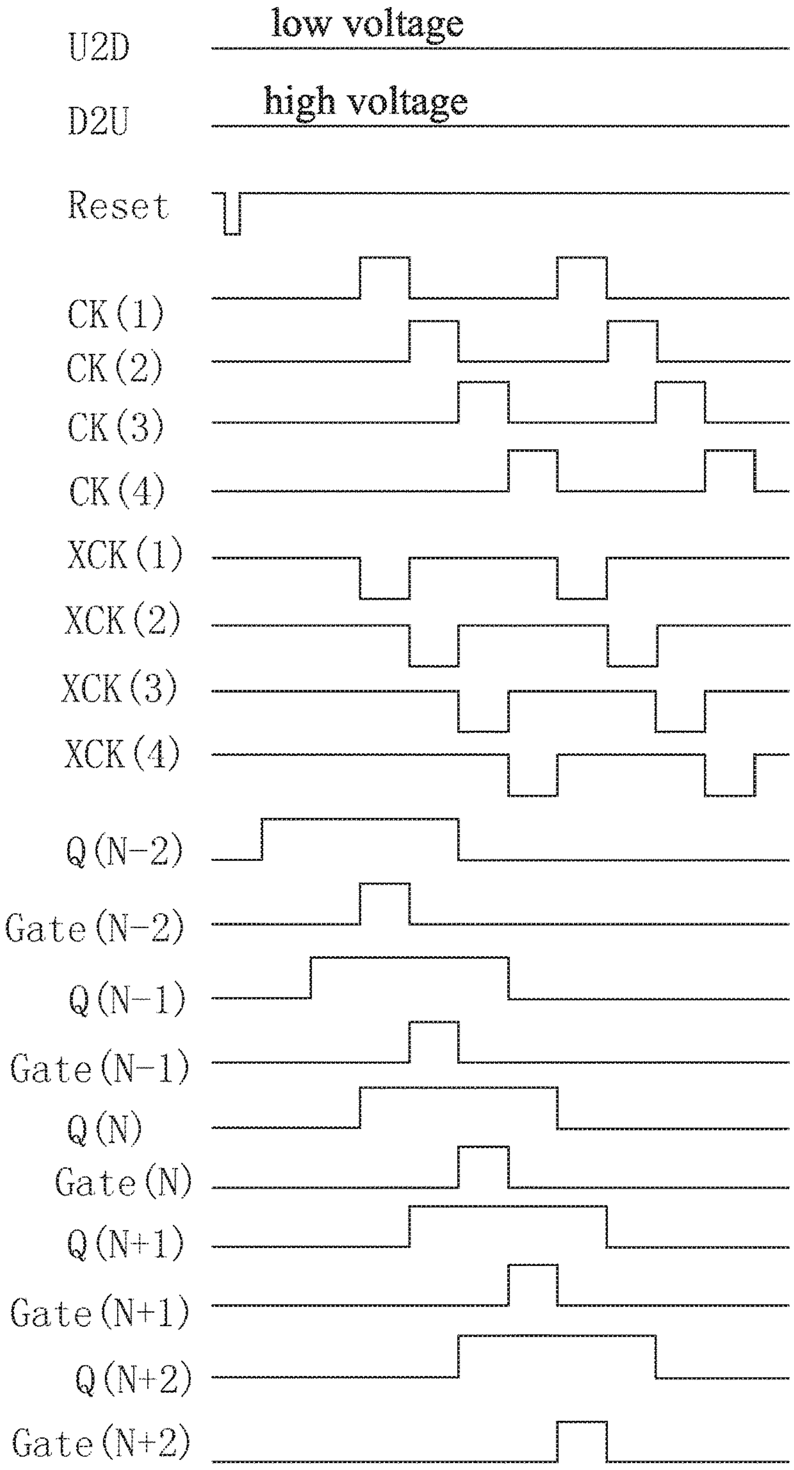
FIG. 11 is a schematic view showing a forward scan timing of the CMOS GOA circuit by the embodiment of the present invention.

Refer to FIG. 11 and FIG. 1. The forward scan process performed by the first embodiment of the CMOS GOA circuit of the present invention is as follows: in the N-th GOA unit, the forward scan signal U2D provides low voltage and the backward scan signal D2U provides high voltage, the first node Q(N−2) of the (N−2)-th GOA unit provides high voltage, the first transmission gate TG1 is turned on and the second transmission gate TG2 is turned off. The high voltage of the first node Q(N−2) of the (N−2)-th GOA unit is transmitted to the input end of the first clock control inverter TF1, and then the first clock signal CK(1) provides high voltage and the first inverse clock signal XCK(1) provides low voltage. The first clock control inverter TF1 is conductive to invert and transmit the high voltage of the input end to the second node P(N) so that the second node P(N) is at low voltage. The voltage of the second node P(N) is inverted by the first inverter IN1 and transmitted to the first node Q(N) so that the first node Q(N) is at high voltage. Then, the first clock signal CK(1) provides low voltage and the first inverse clock signal XCK(1) provides high voltage, the second clock control inverter TF2 is conductive to latch the first node Q(N) at high voltage and to latch the second node P(N) at low voltage. Then, the third clock signal CK(3) provides high voltage and the third inverse clock signal XCK(3) provides low voltage. The first TFT T1 is conductive and the second TFT T2 is shut down. The low voltage of the second node P(N) is transmitted to the third node K(N), and the low voltage of the third node K(N) is inverted three times by the second, the third and the fourth inverters IN2, IN3, IN4, and becomes high voltage. Therefore, the gate scan driving signal Gate(N) is outputted as high voltage. Then, the third clock signal CK(3) provides low voltage and the third inverse clock signal XCK(3) provides high voltage. The first TFT T1 is shut down and the second TFT T2 is conductive. The high voltage of the third inverse clock signal XCM(3) is transmitted to the third node K(N), and the high voltage of the third node K(N) is inverted three times by the second, the third and the fourth inverters IN2, IN3, IN4, and becomes low voltage. Therefore, the gate scan driving signal Gate(N) is outputted as low voltage. Then, the first clock signal CK(1) provides high voltage again and the first inverse clock signal XCK(1) provides low voltage. The first node Q(N−2) of the (N−2)-th GOA unit provides low voltage, the first clock control inverter TF1 is conductive, the second node P(N) becomes high voltage, the first node Q(N) becomes low voltage, and the gate scan driving signal Gate(N) is outputted as low voltage.

In the (N+2)-th GOA unit, the forward scan signal U2D provides low voltage and the backward scan signal D2U provides high voltage, the first clock signal CK(1) provides high voltage for the first time and the first inverse clock signal XCK(1) provides low voltage for the first time. The high voltage of the first node Q(N) of the N-th GOA unit is transmitted to the input end of the first clock inverter TF1. When the third clock signal CK(3) provides high voltage and the third inverse clock signal XCK(3) provides low voltage, the first clock control inverter TF1 is conductive and the high voltage of the first node Q(N) of the N-th GOA unit is inverted so that the second node P(N+2) of the (N+2)-th GOA unit becomes low voltage and the first node Q(N+2) become high voltage. Then, when the third clock signal CK(3) provides low voltage and the third inverse clock signal XCK(3) provides high voltage, the second clock control inverter TF2 is conductive and the second node P(N+2) of the N-th GOA unit is latched at low voltage and the first node Q(N+2) of the (N+2)-th GOA unit is latched at high voltage. When the first clock signal CK(1) provides high voltage for the second time, and the first inverse clock signal XCK(1) provides high voltage for the second time, the first TFT T1 is conductive and the second TFT T2 is shut down. The low voltage of the second node P(N+2) of the (N+2)-th GOA unit is transmitted to the third node K(N+2), and the low voltage of the third node K(N+2) is inverted three times by the second, the third and the fourth inverters IN2, IN3, IN4, and becomes high voltage. Therefore, the gate scan driving signal Gate(N+2) of the (N+2)-th GOA unit is outputted as high voltage. Then, the first clock signal CK(1) provides low voltage and the first inverse clock signal XCK(1) provides high voltage, the first TFT T1 is shut down and the second TFT T2 is conductive. The high voltage of the first inverse clock signal XCM(1) is transmitted to the third node K(N+2) of the (N+2)-th GOA unit, and the high voltage of the third node K(N+2) of the (N+2)-th GOA unit is inverted three times by the second, the third and the fourth inverters IN2, IN3, IN4, and becomes low voltage. Therefore, the gate scan driving signal Gate(N+2) of the (N+2)-th GOA unit is outputted as low voltage. Then, the third clock signal CK(3) provides high voltage again and the third inverse clock signal XCK(3) provides low voltage again. The first node Q(N) of the N-th GOA unit provides low voltage, the first clock control inverter TF1 is conductive, the second node P(N+2) of the (N+2)-th GOA unit becomes high voltage, the first node Q(N+2) of the (N+2)-th GOA unit becomes low voltage, and the gate scan driving signal Gate(N+2) of the (N+2)-th GOA unit is outputted as low voltage; and so on until the last GOA unit.

Refer to FIG. 11 and FIG. 6. The forward scan process performed by the second embodiment of the CMOS GOA circuit of the present invention is the same as the first embodiment, except that the source of the first TFT T1 directly receives the voltage signal of the first node Q(N) and inverts the voltage signal of the first node Q(N) twice before outputting to reduce the stages of inverters by one. As such, the number TFTs is the CMOS GOA circuit is reduced to facilitate the reduction of border size.

Figure 12:
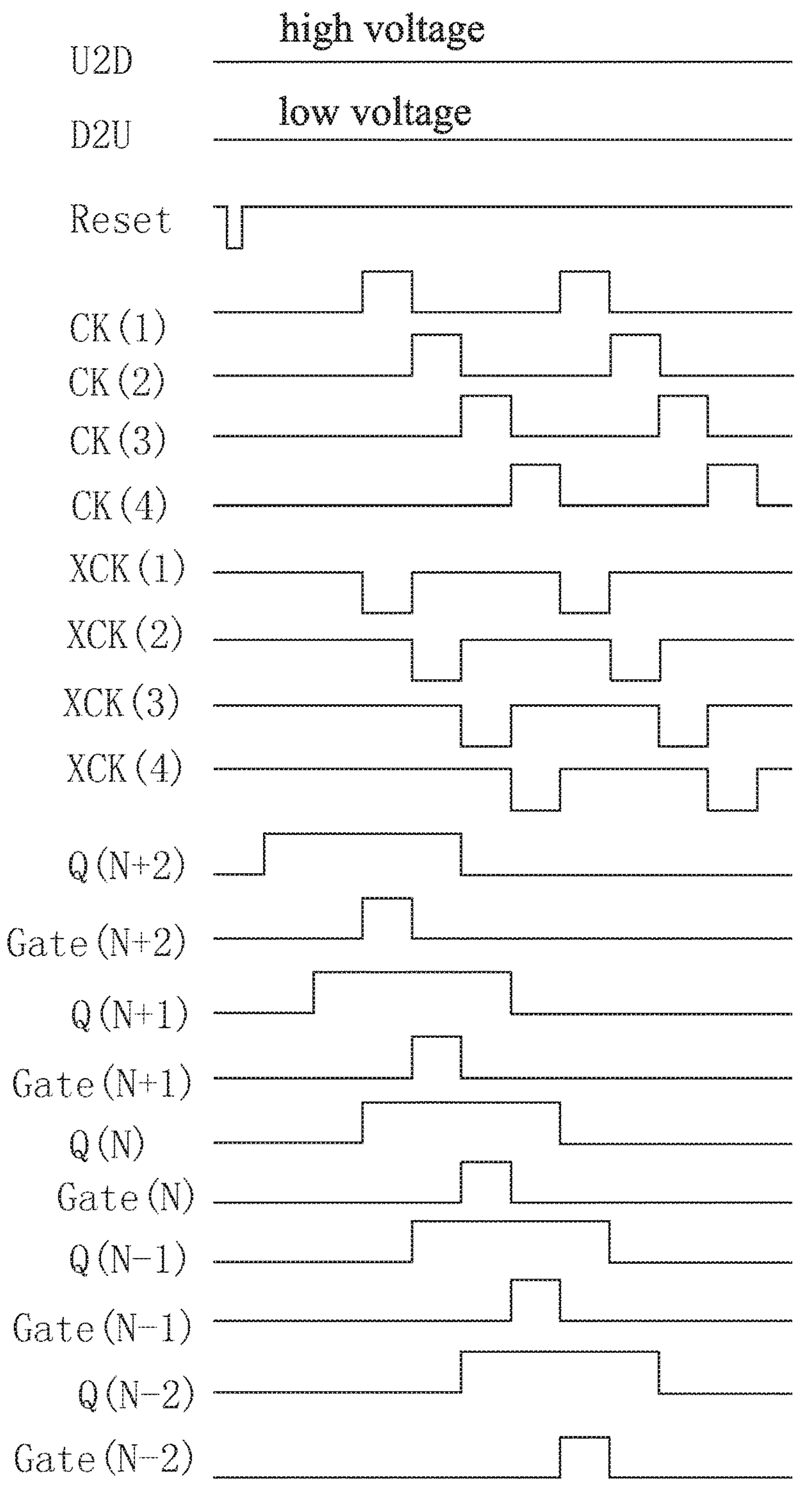
FIG. 12 is a schematic view showing a backward scan timing of the CMOS GOA circuit by the embodiment of the present invention.

Refer to FIG. 12. FIG. 12 is a schematic view showing a backward scan timing of the CMOS GOA circuit by the embodiment of the present invention. The operation process is similar to the forward scan operation, with the only difference in scan direction. In forward scan, the scanning starts from the first stage to the last stage, and in backward scan, the scanning starts from the last stage to the first stage. The details of the backward scan will not be described here.

Moreover, refer to FIG. 11. A reset process is required before scanning, as follow: when the scanning starts, the reset signal Reset provides a low voltage pulse to turn on the third TFT T3 of all the GOA units, the constant high voltage signal VGH writes into the second nodes P(N) of all GOA units to reset to high voltage, the first node Q(N) to low voltage, the gate scan driving signals of all stages are reset to low voltage.

Figure 13:
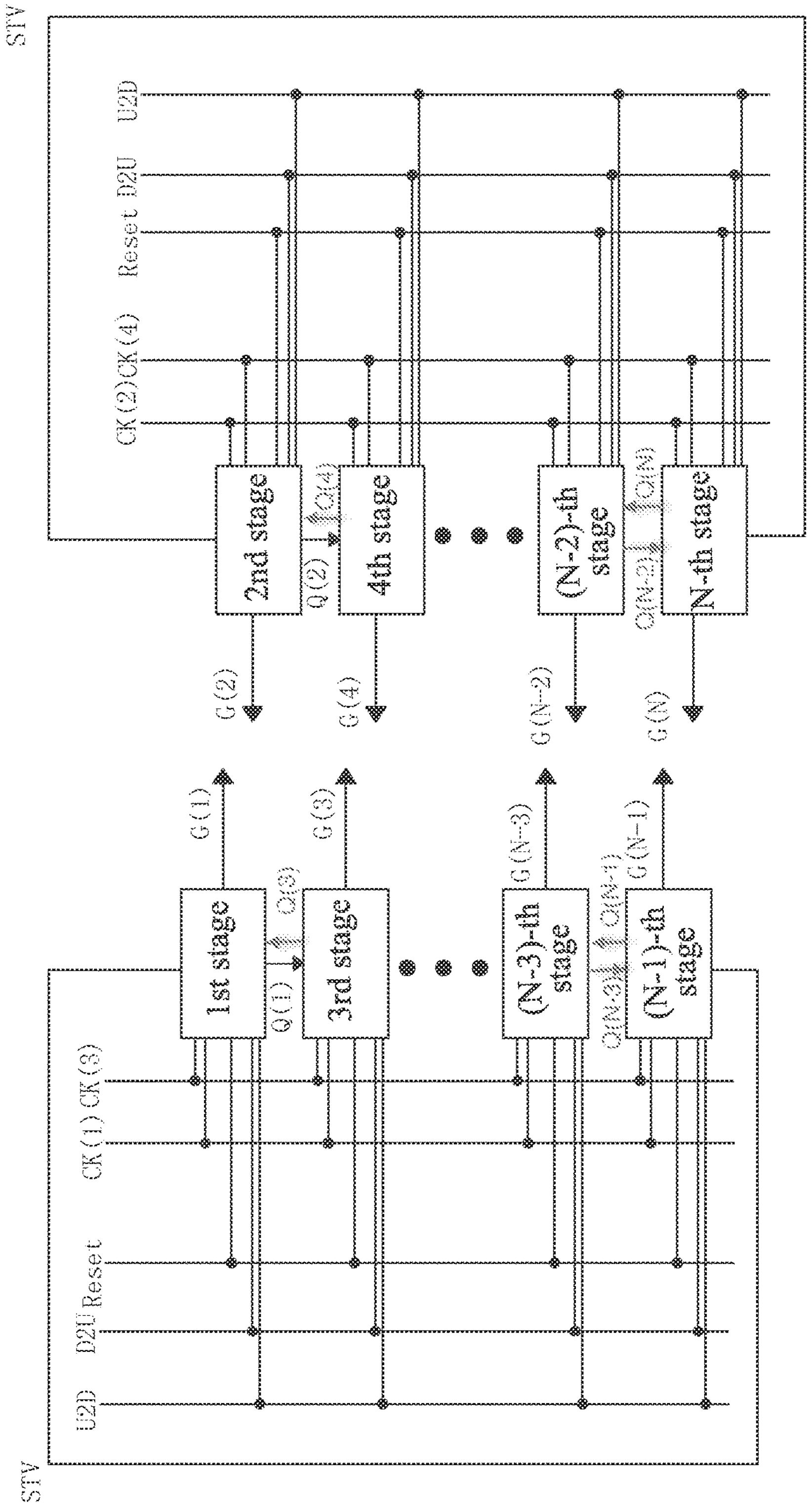
FIG. 13 is a schematic view showing a circuit of the CMOS GOA circuit by the embodiment of the present invention.

Refer to FIG. 13. When the GOA circuit applied to a display panel with a structure of dual-side driving and scan every other row, the GOA units of cascaded odd-numbered stages and the GOA units of cascaded even-numbered stages of the display panel are disposed respectively at left and right sides of the display panel. The GOA units provide corresponding scan signals to the scan lines in the display panel from the first to the last or from the last to the first according to the scan direction.

In summary, the present invention provides a CMOS GOA circuit, comprising a signal processing module having a first TFT and a second TFT, the first TFT having a gate connected to receive a first control signal, a source connected to an output node and a drain connected to a third node; the second TFT having a gate and a source connected to receive a second control signal, and a drain connected to the third node; the first control signal and the second control signal having opposite phases, the first control signal and the second control signal controlling the first TFT and the second TFT to turn on alternatingly input a voltage signal of the output node or a second control signal to the third node; Compared to the known technique using NAND circuit, the present invention reduces the number of TFTs required by the latch module without affecting the normal operation of the circuit, and facilitates the implementation of the ultra-narrow border or borderless display products.

It should be noted that in the present disclosure the terms, such as, first, second are only for distinguishing an entity or operation from another entity or operation, and does not imply any specific relation or order between the entities or operations. Also, the terms “comprises”, “include”, and other similar variations, do not exclude the inclusion of other non-listed elements. Without further restrictions, the expression “comprises a . . . ” does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A complimentary metal-oxide-semiconductor (CMOS) gate driver on array (GOA) circuit, comprising: a plurality of stages of GOA units, wherein the odd-numbered stages of GOA units being cascaded and the even-numbered stages of GOA units being cascaded;

each GOA unit comprising: a forward-and-backward scan control module, a control input module, a reset module, a latch module, a signal processing module, and an output buffer module;

for positive numbers M and N, other than the GOA units in the first stage, the second stage, the second last stage and the last stage, in each N-th GOA unit:

the forward-and-backward scan control module being connected to receive a voltage signal of a first node of the (N−2)-th GOA unit, a voltage signal of a first node of the (N+2)-th GOA unit, a forward scan signal and a backward scan signal, for controlling the GOA circuit to perform forward scan or backward scan according to the voltage change of the forward scan signal and the backward scan signal;

the control input module being connected to the forward-and-backward control module and receiving an M-th clock signal and an M-th inverse clock signal, for inverting the voltage signal of the first node of the (N−2)-th GOA unit or the first node of the (N+2)-th GOA unit transmitted from the forward-and-backward control module according to the M-th clock signal and the M-th inverse clock signal, and outputting to a second node;

the reset module being connected to receive a reset signal and a constant high voltage signal, and connected to the second node for clearing the voltage signal of the first node according to the reset signal;

the latch module being connected to receive the M-th clock signal and the M-th inverse clock signal, and connected to the first node and the second node, for inverting a voltage signal of the second node and outputting to the first node, and latching the voltage signal of the first node according to the M-th clock signal and the M-th inverse clock signal to maintain the voltage signals of the first node and the second node having opposite phases;

the signal processing module comprising: a first TFT and a second TFT; the first TFT having a gate connected to receive a first control signal, a source connected to an output node that is one of the first node and the second node and a drain connected to a third node; the second TFT having a gate and a source connected to receive a second control signal, and a drain connected to the third node; the first control signal and the second control signal having opposite phases, the first control signal and the second control signal controlling the first TFT and the second TFT to turn on alternatingly input a voltage signal of the output node or a second control signal to the third node, wherein the drain of the first TFT and the drain of the second TFT are connected to each other; and the source of the first TFT is connected to the output node that receives a first signal therefrom and the source of the second TFT receives the second control signal as a second signal that is different from the first signal so that the sources of the first and second TFTs are arranged to receive different signals and the signal processing module is operable to selectively and alternatively transmit the first signal and the second signal to the third node;

the output buffer module being connected to the third node, for inverting a voltage signal of the third node a plurality of times before outputting as a gate scan driving signal.

2. The CMOS GOA circuit as claimed in claim 1, wherein the first TFT and the second TFT are N-type TFTs, the output node is the second node, the first control signal is the (M+2)-th clock signal, the second control signal is the (M+2)-th inverse clock signal, the output buffer module inverts the voltage signal of the third node for an odd number of times before outputting as a gate scan driving signal.

3. The CMOS GOA circuit as claimed in claim 2, wherein the output buffer module comprises a second inverter, a third inverter, and a fourth inverter; the second inverter has an input end connected to the third node and an output end connected to an input end of the third inverter; the third inverter has an output end connected to an input end of the fourth inverter; the fourth inverter has an output end outputting the gate scan driving signal.

4. The CMOS GOA circuit as claimed in claim 1, wherein the first TFT and the second TFT are P-type TFTs, the output node is the first node, the first control signal is the (M+2)-th inverse clock signal, the second control signal is the (M+2)-th clock signal, the output buffer module inverts the voltage signal of the third node for an even number of times before outputting as a gate scan driving signal.

5. The CMOS GOA circuit as claimed in claim 4, wherein the output buffer module comprises a second inverter and a third inverter; the second inverter has an input end connected to the third node and an output end connected to an input end of the third inverter; the third inverter has an output end outputting the gate scan driving signal.

6. The CMOS GOA circuit as claimed in claim 4, wherein the clock signals comprises four clock signals: a first clock signal, a second clock signal, a third clock signal, and a fourth clock signal; when the M-th clock signal is the third clock signal, the (M+2)-th t clock signal is the first clock signal; when the M-th clock signal is the fourth clock signal, the (M+2)-th clock signal is the second clock signal;

the GOA units of the cascaded odd-numbered stages are connected to the first clock signal and the third clock signal; the GOA units of the cascaded even-numbered stages are connected to the second clock signal and the fourth clock signal.

7. The CMOS GOA circuit as claimed in claim 1, wherein the forward-and-backward scan control module comprises: a first transmission gate and a second transmission gate; the control input module comprises: a first clock control inverter; the reset module comprises: a third TFT; and the latch module comprises a second clock control inverter and a first inverter;

the first transmission gate has a low voltage control end connected to the forward scan signal, a high voltage control end connected to the backward scan signal, an input end connected to the first node of the (N−2)-th GOA unit, and an output end connected to an input end of the first clock control inverter;

the second transmission gate has a high voltage control end connected to the forward scan signal, a low voltage control end connected to the backward scan signal, an input end connected to the first node of the (N+2)-th GOA unit, and an output end connected to the input end of the first clock control inverter;

the first clock control inverter has a high voltage control end connected to receive the M-th clock signal, a low voltage control end connected to receive the M-th inverse clock signal, and an output end connected to the second node;

the third TFT is a P-type TFT, and has a gate connected to receive the reset signal, a source connected to receive the constant high voltage signal, and a drain connected to the second node;

the second clock control inverter has a low voltage control end connected to receive the M-th clock signal, a high voltage control end connected to receive the M-th inverse clock signal, an input end connected to the first node, and an output end connected to the second node;

the first inverter has an input end connected to the second node and an output end connected to the first node.

8. The CMOS GOA circuit as claimed in claim 7, wherein when the forward scan signal provides low voltage and the backward scan signal provides high voltage, the forward scan is performed; when the forward scan signal provides high voltage and the backward scan signal provides low voltage, the backward scan is performed.

9. The CMOS GOA circuit as claimed in claim 7, wherein in the GOA units of the first stage and the second stage, the input end of the first transmission gate is connected to a start signal of the GOA circuit;

in the GOA units of the last stage and the second last stage, the input end of the second transmission gate is connected to the start signal of the GOA circuit.

10. The CMOS GOA circuit as claimed in claim 1, wherein when the GOA circuit applied to a display panel with a structure of dual-side driving and scan every other row, the GOA units of cascaded odd-numbered stages and the GOA units of cascaded even-numbered stages of the display panel are disposed respectively at left and right sides of the display panel.

11. A complimentary metal-oxide-semiconductor (CMOS) gate driver on array (GOA) circuit, comprising: a plurality of stages of GOA units, wherein the odd-numbered stages of GOA units being cascaded and the even-numbered stages of GOA units being cascaded;

each GOA unit comprising: a forward-and-backward scan control module, a control input module, a reset module, a latch module, a signal processing module, and an output buffer module;

for positive numbers M and N, other than the GOA units in the first stage, the second stage, the second last stage and the last stage, in each N-th GOA unit:

the forward-and-backward scan control module being connected to receive a voltage signal of a first node of the (N−2)-th GOA unit, a voltage signal of a first node of the (N+2)-th GOA unit, a forward scan signal and a backward scan signal, for controlling the GOA circuit to perform forward scan or backward scan according to the voltage change of the forward scan signal and the backward scan signal;

the control input module being connected to the forward-and-backward control module and receiving an M-th clock signal and an M-th inverse clock signal, for inverting the voltage signal of the first node of the (N−2)-th GOA unit or the first node of the (N+2)-th GOA unit transmitted from the forward-and-backward control module according to the M-th clock signal and the M-th inverse clock signal, and outputting to a second node;

the reset module being connected to receive a reset signal and a constant high voltage signal, and connected to the second node for clearing the voltage signal of the first node according to the reset signal;

the latch module being connected to receive the M-th clock signal and the M-th inverse clock signal, and connected to the first node and the second node, for inverting a voltage signal of the second node and outputting to the first node, and latching the voltage signal of the first node according to the M-th clock signal and the M-th inverse clock signal to maintain the voltage signals of the first node and the second node having opposite phases;

the signal processing module comprising: a first TFT and a second TFT; the first TFT having a gate connected to receive a first control signal, a source connected to an output node that is one of the first node and the second node and a drain connected to a third node; the second TFT having a gate and a source connected to receive a second control signal, and a drain connected to the third node; the first control signal and the second control signal having opposite phases, the first control signal and the second control signal controlling the first TFT and the second TFT to turn on alternatingly input a voltage signal of the output node or a second control signal to the third node, wherein the drain of the first TFT and the drain of the second TFT are connected to each other; and the source of the first TFT is connected to the output node that receives a first signal therefrom and the source of the second TFT receives the second control signal as a second signal that is different from the first signal so that the sources of the first and second TFTs are arranged to receive different signals and the signal processing module is operable to selectively and alternatively transmit the first signal and the second signal to the third node;

the output buffer module being connected to the third node, for inverting a voltage signal of the third node a plurality of times before outputting as a gate scan driving signal;

wherein the first TFT and the second TFT being N-type TFTs, the output node being the second node, the first control signal being the (M+2)-th clock signal, the second control signal being the (M+2)-th inverse clock signal, the output buffer module inverting the voltage signal of the third node for an odd number of times before outputting as a gate scan driving signal;

when the GOA circuit applied to a display panel with a structure of dual-side driving and scan every other row, the GOA units of cascaded odd-numbered stages and the GOA units of cascaded even-numbered stages of the display panel being disposed respectively at left and right sides of the display panel.

12. The CMOS GOA circuit as claimed in claim 11, wherein the forward-and-backward scan control module comprises: a first transmission gate and a second transmission gate; the control input module comprises: a first clock control inverter; the reset module comprises: a third TFT; and the latch module comprises a second clock control inverter and a first inverter;

the first transmission gate has a low voltage control end connected to the forward scan signal, a high voltage control end connected to the backward scan signal, an input end connected to the first node of the (N−2)-th GOA unit, and an output end connected to an input end of the first clock control inverter;

the second transmission gate has a high voltage control end connected to the forward scan signal, a low voltage control end connected to the backward scan signal, an input end connected to the first node of the (N+2)-th GOA unit, and an output end connected to the input end of the first clock control inverter;

the first clock control inverter has a high voltage control end connected to receive the M-th clock signal, a low voltage control end connected to receive the M-th inverse clock signal, and an output end connected to the second node;

the third TFT is a P-type TFT, and has a gate connected to receive the reset signal, a source connected to receive the constant high voltage signal, and a drain connected to the second node;

the second clock control inverter has a low voltage control end connected to receive the M-th clock signal, a high voltage control end connected to receive the M-th inverse clock signal, an input end connected to the first node, and an output end connected to the second node;

the first inverter has an input end connected to the second node and an output end connected to the first node.

13. The CMOS GOA circuit as claimed in claim 12, wherein when the forward scan signal provides low voltage and the backward scan signal provides high voltage, the forward scan is performed; when the forward scan signal provides high voltage and the backward scan signal provides low voltage, the backward scan is performed.

14. The CMOS GOA circuit as claimed in claim 12, wherein in the GOA units of the first stage and the second stage, the input end of the first transmission gate is connected to a start signal of the GOA circuit;

in the GOA units of the last stage and the second last stage, the input end of the second transmission gate is connected to the start signal of the GOA circuit.

15. The CMOS GOA circuit as claimed in claim 11, wherein the output buffer module comprises a second inverter, a third inverter, and a fourth inverter; the second inverter has an input end connected to the third node and an output end connected to an input end of the third inverter; the third inverter has an output end connected to an input end of the fourth inverter; the fourth inverter has an output end outputting the gate scan driving signal.

16. The CMOS GOA circuit as claimed in claim 11, wherein the clock signals comprises four clock signals: a first clock signal, a second clock signal, a third clock signal, and a fourth clock signal; when the M-th clock signal is the third clock signal, the (M+2)-th t clock signal is the first clock signal; when the M-th clock signal is the fourth clock signal, the (M+2)-th clock signal is the second clock signal;

the GOA units of the cascaded odd-numbered stages are connected to the first clock signal and the third clock signal; the GOA units of the cascaded even-numbered stages are connected to the second clock signal and the fourth clock signal.

* * * * *